United States Patent [19]

Harada

[11] Patent Number: 5,180,931
[45] Date of Patent: Jan. 19, 1993

[54] SAMPLING METHOD AND CIRCUIT

[75] Inventor: Hajime Harada, Tokyo, Japan

[73] Assignee: Nihon Kohden Corporation, Tokyo, Japan

[21] Appl. No.: 764,611

[22] Filed: Sep. 24, 1991

Related U.S. Application Data

[63] Continuation-in-part of Ser. No. 441,069, Nov. 22, 1989, abandoned.

[30] Foreign Application Priority Data

Feb. 12, 1988 [JP] Japan .................................. 63-304079

[51] Int. Cl.⁵ ...................... H03K 5/153; G11C 27/02
[52] U.S. Cl. ..................................... 307/353; 307/351; 328/117; 328/151
[58] Field of Search ................ 307/351, 353; 328/115, 328/116, 117, 151

[56] References Cited

U.S. PATENT DOCUMENTS

| 3,693,028 | 9/1972 | Fussell | 328/117 |
| 3,727,144 | 4/1973 | Sendo | 328/151 |
| 4,183,087 | 1/1980 | Huelsman | 328/151 |
| 4,363,976 | 12/1982 | Minor | 307/353 |
| 4,737,730 | 4/1988 | Ishiwata et al. | 328/151 |

Primary Examiner—John Zazworsky
Attorney, Agent, or Firm—Hoffmann & Baron

[57] ABSTRACT

A method and circuit for sampling input waveform signals at a predetermined periodic rate by detecting a peak and a bottom value during each period. The method further includes holding a peak value and a bottom value of an input waveform signal whenever they are generated as hold values and resetting the hold value to the current input waveform signal level so as to obtain a high-fidelity sampling output. The peak level or the bottom level is generated as a sampling value according to which is operating, the peak hold or bottom hold, at the sampling time. If both are currently not operating, then outputting the hold which was the last in operation.

4 Claims, 8 Drawing Sheets $x_0$ : SAMPLING OUTPUT DATA $x_i$ : INPUT DATA OF MICROCOMP. 21
$x_m$ : OUTPUT DATA OF A/D CONVERTER 20
$D_P$ : PEAK VALUE
$D_B$ : BOTTOM VALUE
FF : FLIP FLOP FUNCTION (PRIOR ART)

SAMPLING METHOD AND CIRCUIT

CROSS REFERENCE TO RELATED APPLICATIONS

This is a continuation-in-part application of copending application entitled "Sampling Method And Circuit", Ser. No. 07/441,069 filed on Nov. 22, 1989, which is now abandoned.

BACKGROUND OF THE INVENTION

1. Field of the Invention

The present invention relates to a method and circuit for sampling input waveform signals at a predetermined periodic rate and detecting a peak point and a bottom point in each sampling period.

2. Description of the Prior Art

As known hitherto, a prior art sampling method includes, as shown in FIG. 7, comparing a sampling value obtained immediately before the beginning of a sampling period with the sampling period peak and bottom values to determine which value has the greatest difference from the sampling value during the period of sampling. The value which is output corresponds to the peak or bottom value which results in the greatest difference from the sampling value.

According to this method and referring to this FIG. 7, no problem may be encountered at sampling points $t_1$ to $t_4$ where the difference value to a peak level is less than that to a bottom level within each sampling period. However, despite a peak arising between $t_5$ and $t_6$, the peak level $L_P$ will not be output since the difference from the sampled value is greater to bottom level $L_B$. Accordingly, where, for example, QRS wave of an electrocardiogram signal is sampled, a peak value when the sampling value is reproduced sharply fluctuates as compared with an input waveform despite the peak level being almost uniform.

SUMMARY OF THE INVENTION

It is therefore an object of the present invention to provide a sampling method and circuit whereby peak and bottom values within each sampling period can be accurately detected.

In order to attain the aforementioned object, whenever a peak value or a bottom value of an input waveform signal is detected within a sampling period, a holding operation is carried out by resetting the peak or bottom hold means to the current level (peak value or bottom value) of the input waveform signal. When the input waveform signal is greater than the last peak hold value, then the peak hold means will be operating. However, when the input waveform signal is less than the last bottom hold value, then the bottom hold means will be in operation. If the peak hold means is in operation at the time of sampling, then the bottom hold value will be output as a sampling value. But when the bottom hold means is in operation at the time of sampling, then the peak hold value will be output as a sampling value. If both the peak and bottom hold means are not in operation at the sampling time, this indicates that the current input waveform signal is not greater than the last peak hold value nor less than the last bottom hold value. According to the invention, the hold means which was last in operation determines which hold value will be output as a sampling value.

Thus according to the present invention, a high-fidelity sampling output capable of detecting a peak and bottom value in each sampling period can be obtained when sampling an input waveform signal. Particularly for sampling a continuous pulse with peak values in order, the peak values will never fluctuate after sampling.

DETAILED DESCRIPTION OF THE PREFERRED EMBODIMENTS

Figure 1:
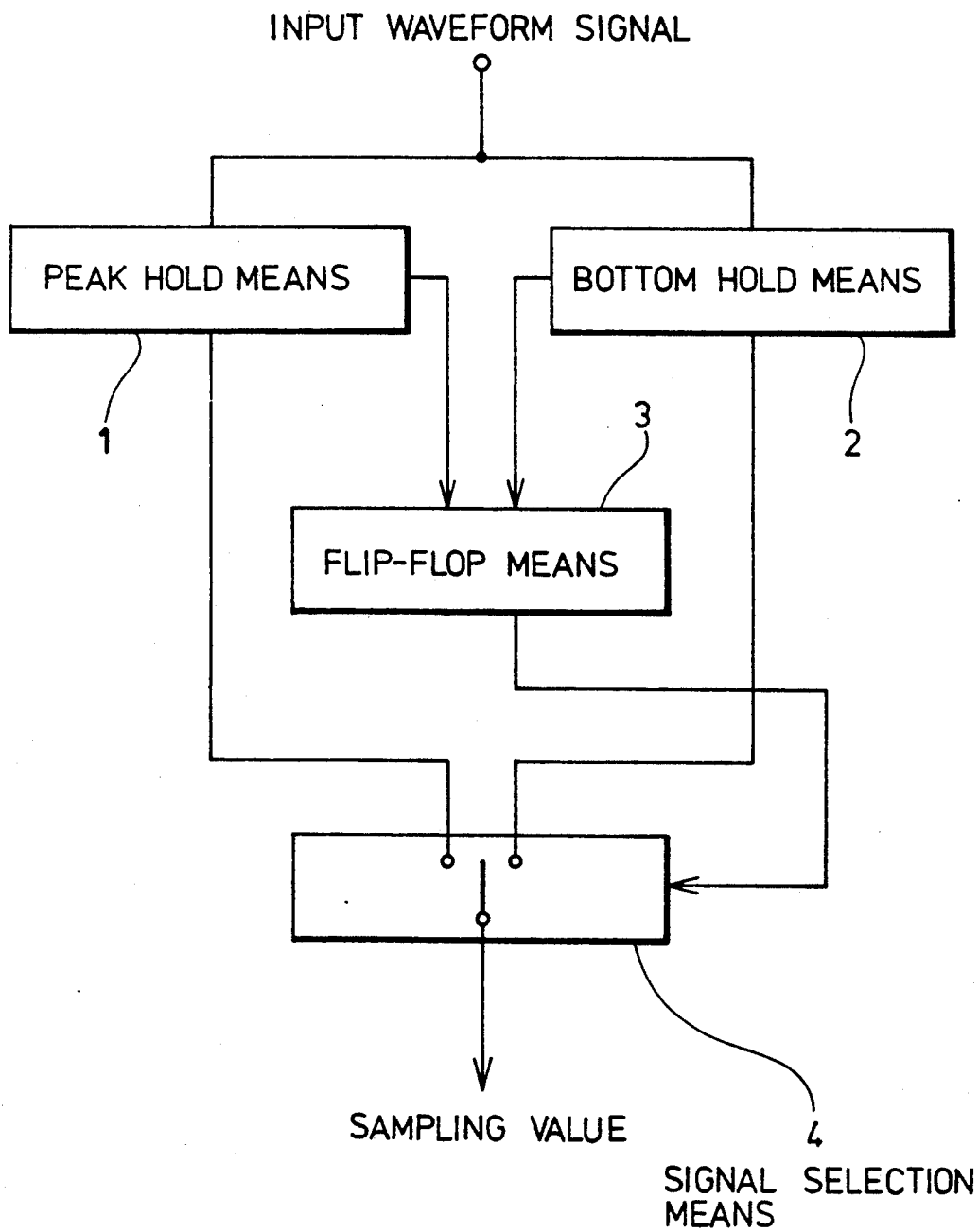
FIG. 1 is a functional diagram of a sampling circuit given in a principle embodiment of the invention.

FIG. 1 represents a sampling circuit for implementing the method of the invention.

In the drawing, 1 and 2 denote peak hold means and bottom hold means respectively for holding a peak value and a bottom value of the input waveform signal by resetting a corresponding hold means to the circuit input waveform signal value whenever a local peak or bottom value is determined. A reference numeral 3 denotes a flip-flop means triggered at the leading edge of an actuating signal. The flip-flop indicates which peak hold means 1 or bottom hold means 2 is in operation. A reference numeral 4 denotes a signal selection means for outputting the bottom level as the sampling value when the flip-flop means is triggered by the peak hold means 1, and for outputting the peak level as the sampling value when the flip-flop means is triggered by the bottom hold means 2.

An operation of the sampling circuit as constructed above will now be described with reference to FIG. 2.

Figure 2:
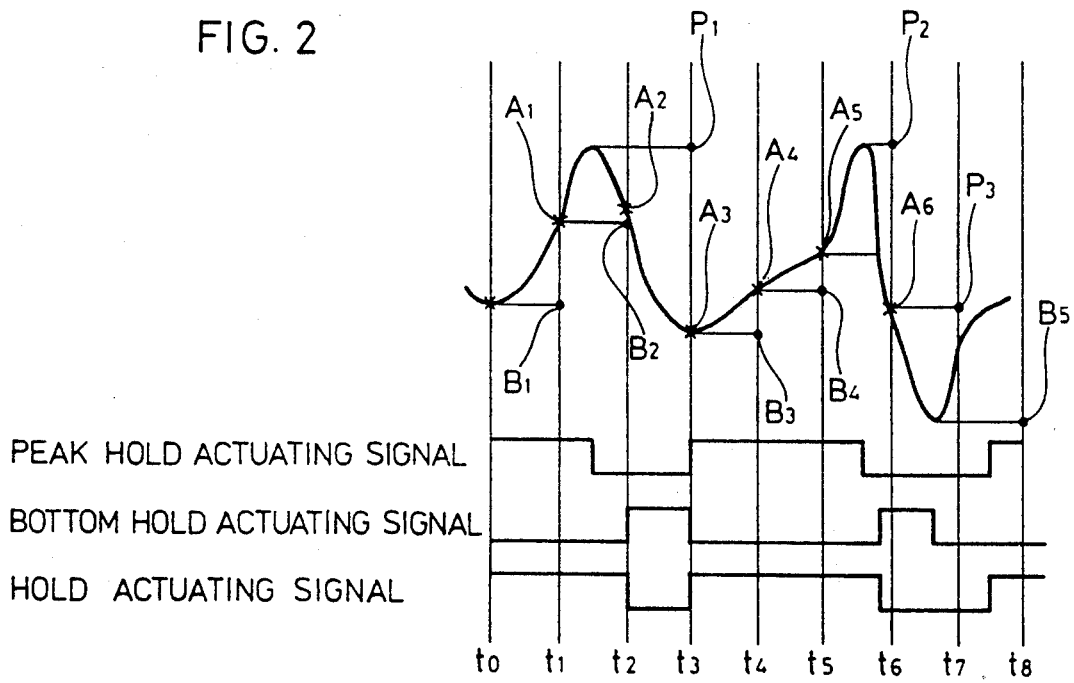
FIG. 2 is a time chart for illustrating an operation thereof.

As shown in FIG. 2 at sampling time $t_1$, the peak hold means 1 is operating for peak hold at sampling time $t_1$ which indicates that the input waveform is currently increasing. Therefore, a peak hold actuating signal (H level) is supplied to the flip-flop means 3, and the flip-flop means 3 generates a hold actuating signal of H level. Since the peak hold means 1 is indicating an increasing signal, the bottom hold means 2 outputs a bottom value $B_1$ through the signal selection means 4. The bottom hold means 2 then holds a new actual value $A_1$.

Both the peak hold means 1 and bottom hold means 2 are not operating at $t_2$ because the current input waveform value is not above the peak hold value nor below the bottom hold values currently stored in the hold means. Specifically, the peak hold operation was turned off after the input signal reached its maximum value between $t_1$ and $t_2$. The bottom hold operation is not turned on until the current input waveform value falls below the value stored in the bottom hold means.

Therefore the hold actuating signal is still on H level and a bottom hold value $B_2$ is output as the sampling value while a new actual value $A_2$ is held by the bottom hold means. At time $t_2$, the bottom hold means 2 has a bottom hold operation and the hold actuating signal is inverted to L level by the flip-flop means 3 according to the rise of the bottom hold actuating signal to H level. The peak hold means 1 outputs its peak hold value $P_1$ at $t_3$ and holds a new actual value $A_3$. Accordingly, the peak hold operation is recommenced and the operation is continued to $t_4$ and $t_5$, for the ascending waveform. A bottom value $B_3$ is generated at $t_4$, the bottom hold value is reset to an actual value $A_4$ and then generated as a bottom value $B_4$ at $t_5$. Since the input waveform level is lower than the held actual value $A_5$ immediately before $t_6$, the bottom hold recommences operation. Accordingly, a peak value $P_2$ is generated at $t_6$, and the peak hold value is reset to an actual value $A_6$. Since the bottom hold is turned off before $t_7$ and the peak hold means has not recommenced operation, a peak value $P_3$ corresponding to the actual value $A_6$ is generated at $t_7$. A bottom value $B_5$ is generated at $t_8$ since the hold actuating signal is on H-level once again.

Thus, as compared with the prior art method, peak and bottom values of each sampling period are accurately regenerated lagging one period.

Figure 3:
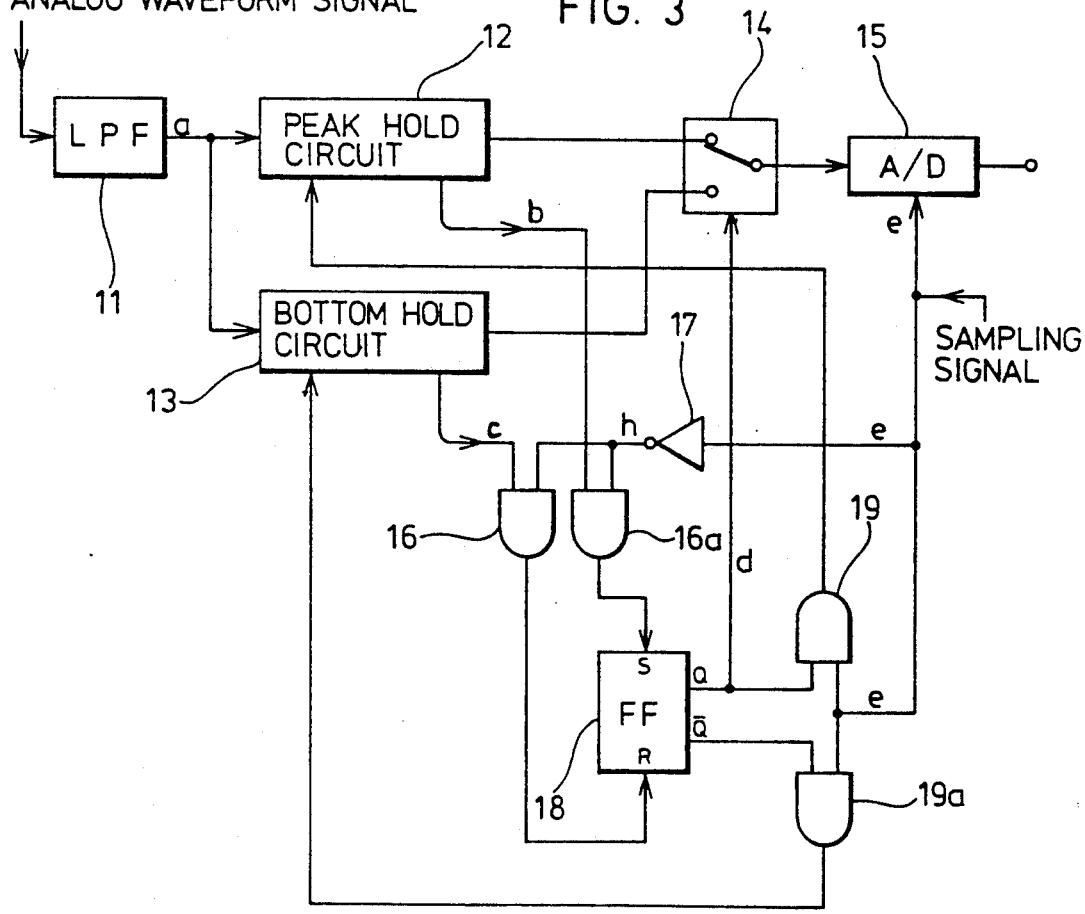
FIG. 3 is a functional diagram of a sampling circuit given in a detailed embodiment of the invention.

FIG. 3 represents a discrete sampling circuit of one embodiment. In the drawing, 11 denotes a low-pass filter for removing the high frequency component which is more than $\frac{1}{2}$ times the sampling frequency of the inputted analog waveform signal. Reference numeral 12 denotes a peak hold circuit for holding the peak level of the filter output signal a, and for resetting the peak hold value to a new level of the actual filter output signal a whenever outputting the held peak value. Reference numeral 13 denotes a bottom hold circuit for holding a bottom value of the filter output signal a, and resetting the bottom hold value to the actual filter output signal a whenever the bottom value is output. Peak and bottom hold circuits 12 and 13 interrupt the hold operation while the sampling signal supplied through AND gates 19 and 19a is generated. The hold circuits then reset the held value to the current input waveform level of the filter output signal a immediately after the interruption. Both circuits respectively generate a peak hold actuating signal b and a bottom hold actuating signal c. By utilizing a comparator which compares the filter output signal a with each of the hold actuating signals, it can be determined which of the peak hold and bottom hold circuits is currently operating and holding a new value.

A reference numeral 14 denotes a selector circuit for selecting the output of either hold circuit 12 and 13 in response to a pulsing signal d generated by the flip-flop 18. The selection made by the selector circuit is fed to an A/D converter 15.

The flip-flop 18 sets and resets the peak hold actuating signal b and the bottom hold actuating signal c, the bottom hold and peak hold actuating signals c and b are respectively supplied through AND gates 16 and 16a. Then, a signal h provided by a sampling signal e of the A/D converter 15 being inverted by a signal inverter 17, is supplied as one input of the AND gates 16 and 16a. Thus the flip-flop 18 is prevented from triggering during A/D conversion and the selector circuit 14 is kept from changing.

Figure 8:
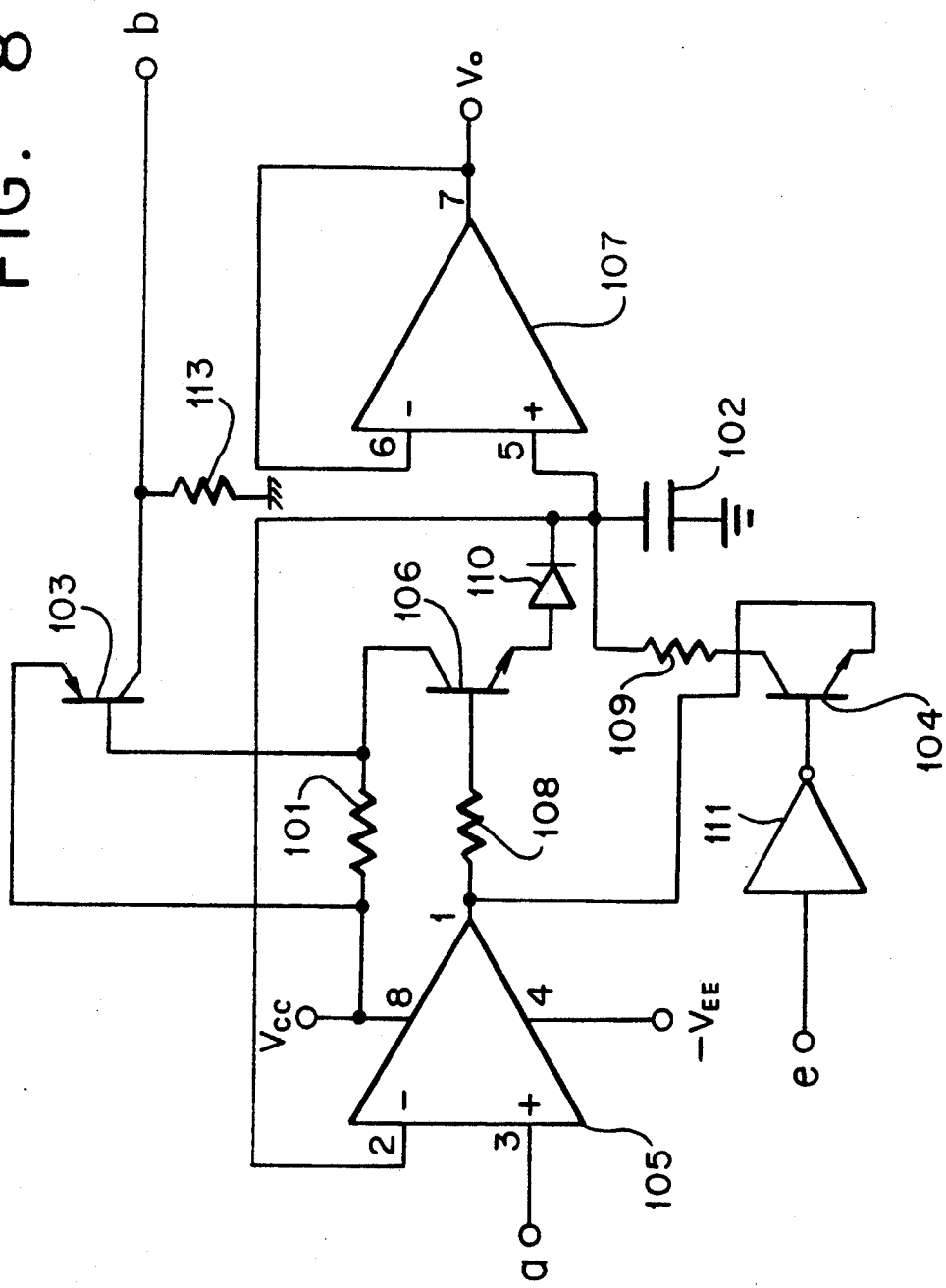
FIG. 8 is a circuit diagram of one peak hold circuit used in the sampling circuit shown in FIG. 3.

FIG. 8 shows one possible implementation of National Semiconductor Corporation integrated circuit LF412A/LF412 so as to provide a peak hold circuit which could be used in the sampling circuit of the current invention. The numbers at the inputs of each LF412 integrated circuit 105 correspond to the pin input/output ports on the LF412 chip. According to FIG. 8, in order to produce the peak hold actuating signal b of FIG. 3, resistor 101 is coupled between pin 8 of chip 105 and the collector of transistor 106 while resistor 108 is coupled between pin 1 of chip 105 and the base of transistor 106. Input pin 3 of chip 105 received the output signal a of the low pass filter 11 while pin 4 is coupled as -$V_{EE}$. Pin 8 is coupled to $V_{CC}$. In addition, amplifying transistor 103 is coupled across resistor 101 and its collector is coupled to resistor 113. Output b is taken off the collector of transistor 103. In order to reset the output to the input signal level, the emitter of transistor 104 is connected to the output terminal 1 of integrated circuit 105 while the base of the transistor 104 is coupled to inverter 111 and receives an inverted sampling signal e which is provided through gate 19. The collector of transistor 104 is coupled through resistor 109 to capacitor 102 and pin 5 of integrated circuit 107. Diode 110 is coupled to the emitter of transistor 106 and to pin 2 of integrated circuit 105 and pin 5 of integrated circuit 107. Pin 6 and pin 7 of integrated circuit 107 are coupled together. In a preferred embodiment, resistor 108 is a 3.3 k resistor while resistor 109 has a value of 10 k and capacitor 102 is a 0.01 µF capacitor.

Figure 9:
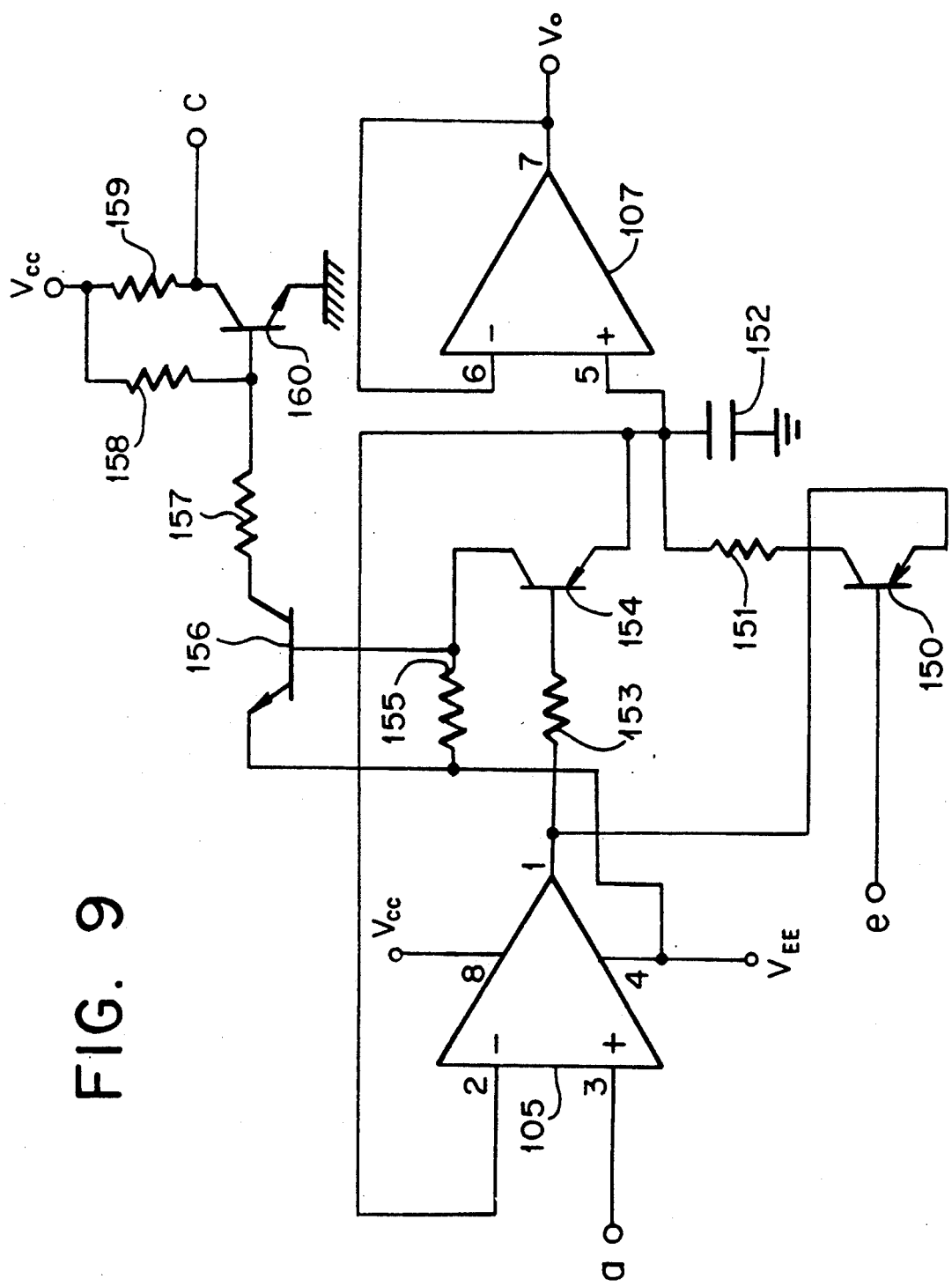
FIG. 9 is a circuit diagram of one bottom hold circuit used in the sampling circuit shown in FIG. 3.

FIG. 9 shows one possible implementation of National Semiconductor Corporation integrated circuit LF412A/LF412 so as to provide a bottom hold circuit which could be utilized in the sampling circuit of the current invention. As shown in FIG. 9, pins 1–4 and 8 correspond to integrated circuit 105 and pins 5–7 correspond to integrated circuit 107. Pin 3 receives the output signal a of low pass filter 11 while pin 8 is connected to Vcc and pin 4 is coupled to -$V_{EE}$. Pin 2 of integrated circuit 105 is coupled to pin 5 of integrated circuit 107. In order to produce the bottom hold actuating signal c, the sampling signal e which is provided through gate 19A is supplied without inversion to the base of transistor 150 while the emitter is coupled to output pin 1 of integrated circuit 105 and the collector is coupled to pin 5 of integrated circuit 107 through resistor 151. Capacitor 152 is connected to pin 5 and to the ground reference. Pin 5 is also coupled to the emitter of transistor 154. The base of transistor 154 is coupled to resistor 153 which is connected to output pin 1 of integrated circuit 105. The collector of transistor 154 is coupled to pin 4 of through resistor 155. The base of transistor 156 is coupled to the collector of transistor 154. The collector of transistor 156 is coupled to the base of transistor 160 through resistor 157. The base of transistor 160 is also coupled to $V_{CC}$ through resistor 158 while the collector is coupled to $V_{CC}$ through resistor 159 and the emitter is coupled to a ground reference. The output signal c is taken from the collector of transistor 160 as shown in FIG. 9. In a preferred embodiment, resistor 153 is a 3.3 k resistor, resistor 151 is a 10 k resistor and capacitor 152 has a value of 0.01 µF.

Figure 4:
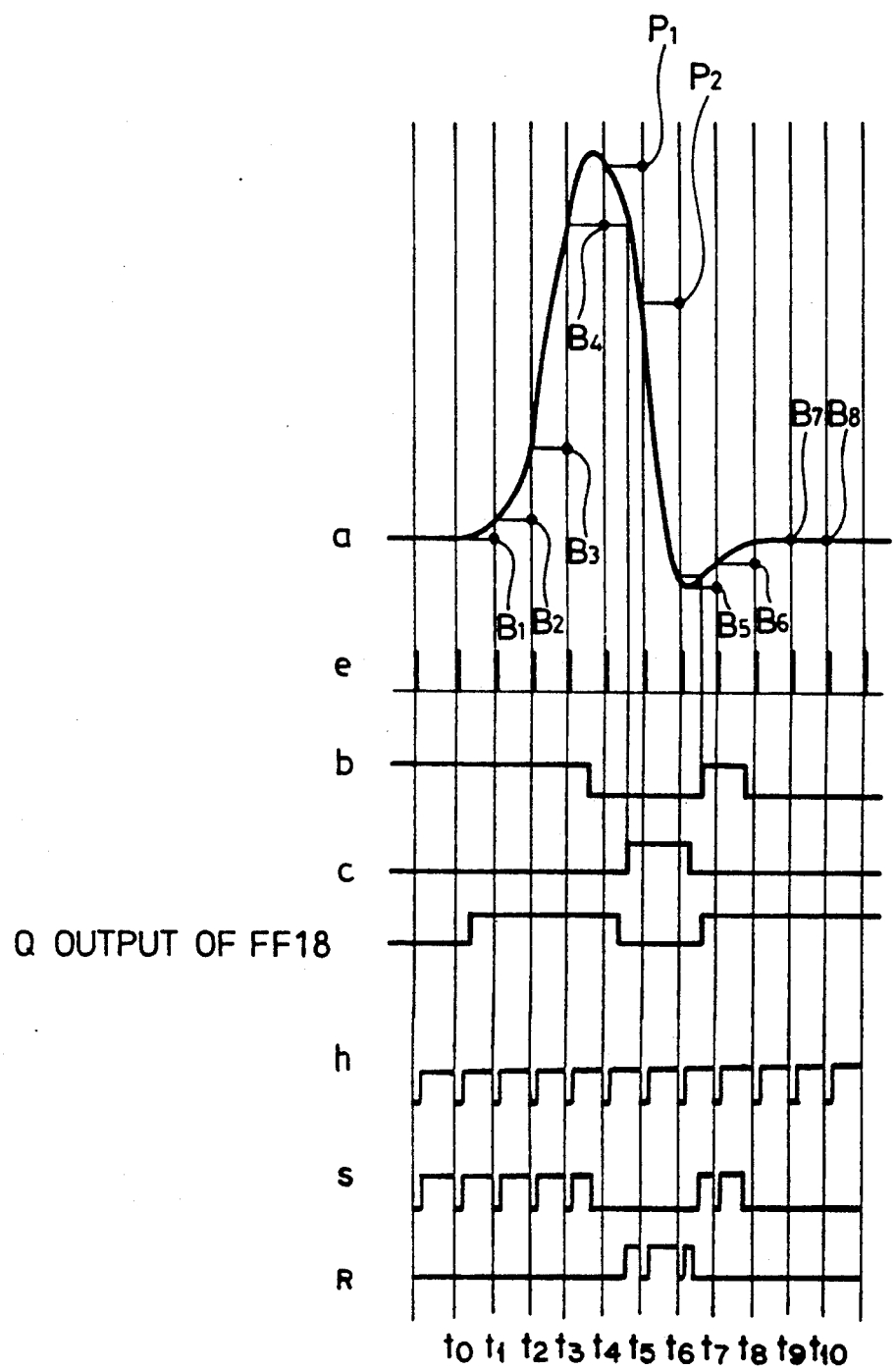
FIG. 4 is a time chart for illustrating a circuit operation according to the embodiment of FIG. 3.

Next, the operation will be described with reference to FIG. 4.

The filter output signal a rises between the sampling points $t_0$ and $t_3$. Accordingly, the peak hold actuating signal b is on H level, the flip-flop 18 is kept set, and Q output is on H level. Thus, the selector circuit 14 selects the bottom hold circuit 13 continuously and generates the bottom values $B_1$ to $B_3$ as resetting the hold value to an actual signal value at every input of the sampling signal e, and has the A/D converter 15 operate for digital conversion. The peak hold actuating signal b changes to L level at the points in peak time $t_3$ and $t_4$. Then at $t_4$, since the flip-flop 18 is still not reset, the selector circuit 14 selects the bottom value $B_4$. On the way to reaching $t_5$, where the level of the filter output signal a is lower than the hold value of the bottom hold circuit 13, the bottom hold actuating signal c is generated, and the flip-flop 18 is reset to L level. Accordingly, the peak value $P_1$ of the peak hold circuit 12 is selected at $t_5$, and the peak value is reset to an actual input level at this time. A bottom value is generated between $t_6$ and $t_7$. Therefore the bottom hold actuating signal c is terminated and the peak hold circuit 12 is reactuated at the point in time where the signal a is higher than the peak value held at $t_6$ to generate the peak hold actuating signal b and reset the flip-flop 18. The bottom value $B_5$ is sampled at $t_7$ and the bottom value $B_6$ is also sampled at $t_8$, which are reset to a reference level at $t_9$. Thereafter, a flat steady state is maintained.

Figure 5:
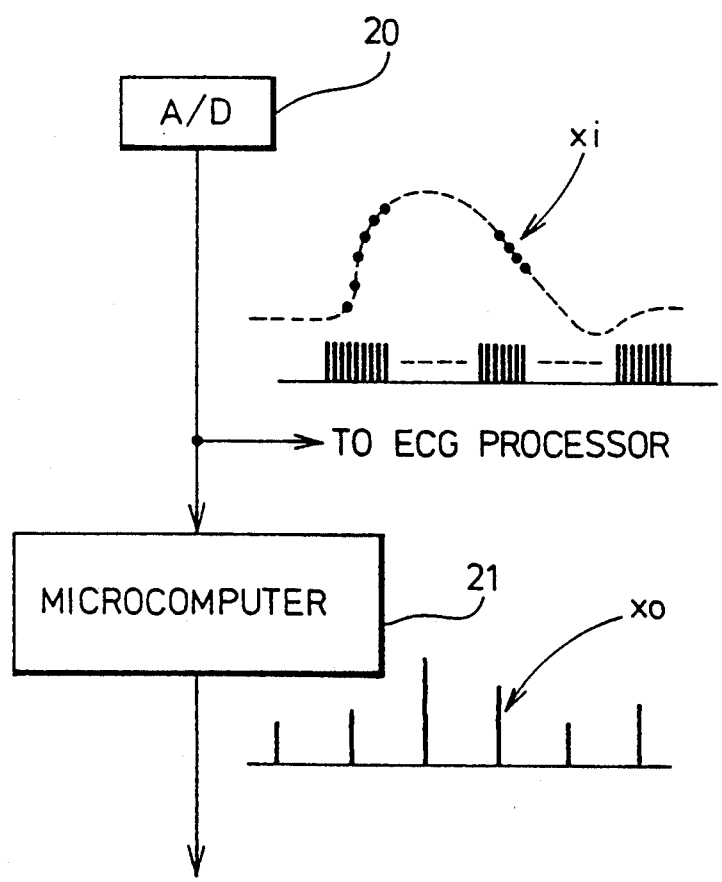
FIG. 5 is a functional diagram of a sampling circuit given in another embodiment of the invention.
Figure 6A:
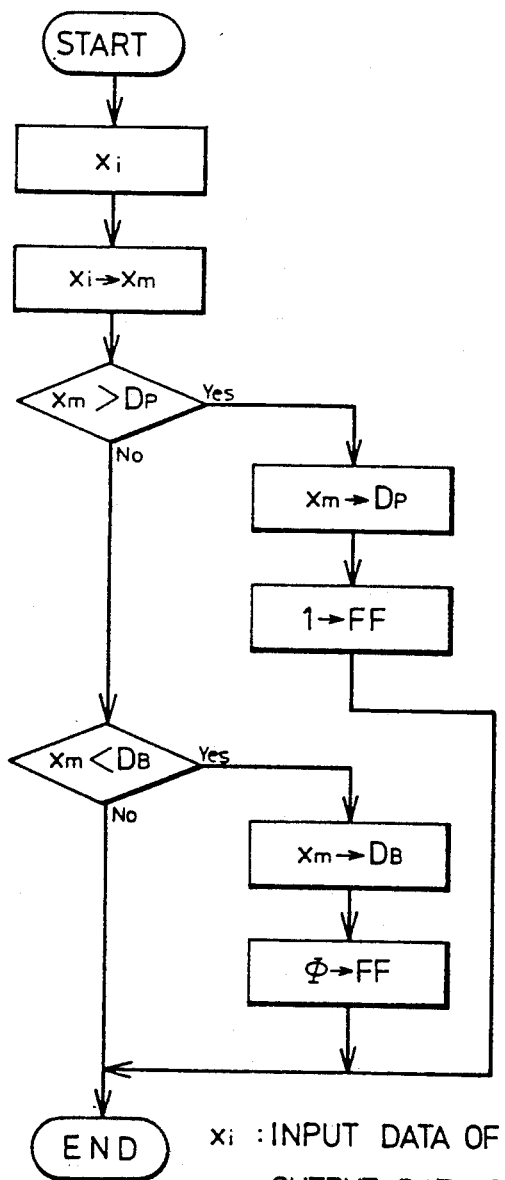
FIGS. 6a and 6b are flowcharts for illustrating a circuit operation according to the embodiment of FIG. 5.
Figure 6B:
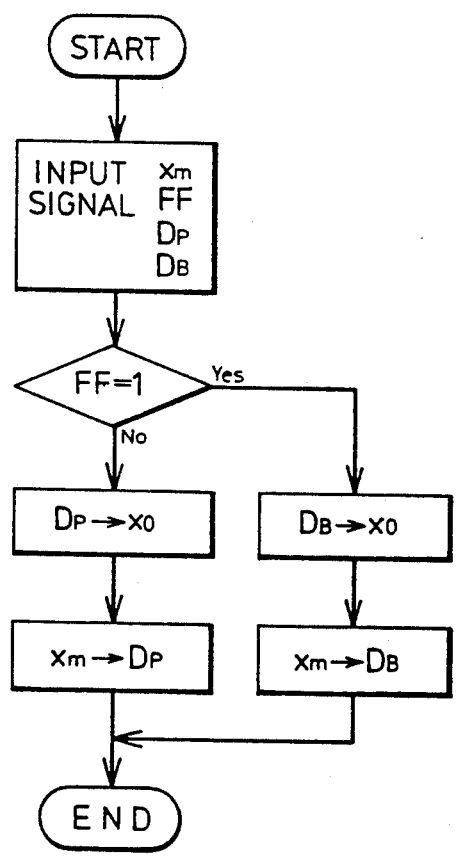
Figure 7:
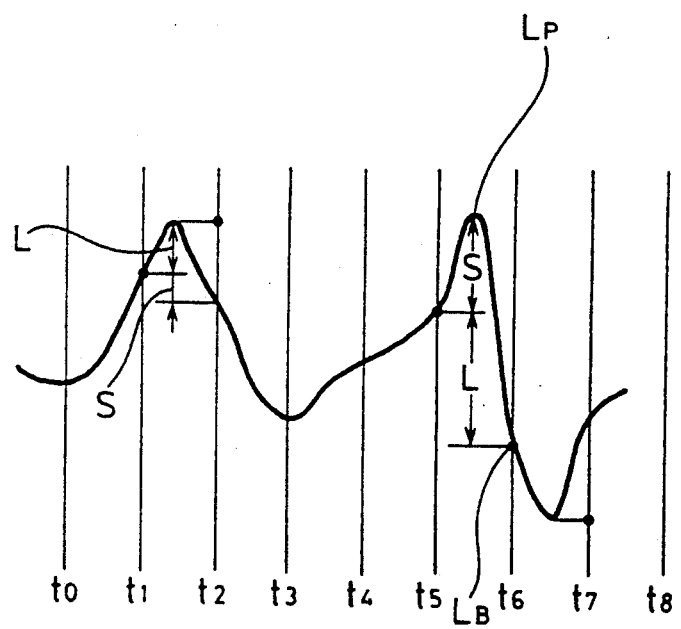
FIG. 7 is a time chart illustrating a prior art sampling method.

FIG. 5 represents an example wherein the invention is applied to an electrocardiogram processor displaying at 1.25 mm/s on a liquid crystal display unit 0.3 mm in dot pitch. In the A/D converter 20, sampling is carried out by a sampling pulse at intervals of 4 ms. A data signal for instrumentation is generated and a timing signal of QRS wave is generated at a longer period of 24 ms, for example, by a microcomputer 21 for the liquid crystal display. The microcomputer 21 holds a peak value $D_P$ and a bottom value $D_B$ of each period at a longer time interval by thinning out sampling pulses at intervals of 24 ms according to a principle of the invention shown in the flowchart of FIG. 6(a). Microcomputer 21 then carries out a preprocessing decision corresponding to the aforementioned flip-flop function depending upon whether a peak hold or bottom hold is or was in operation at the time of sampling. Then, according to FIG. 6(b), the peak value $D_P$ or the bottom value $D_B$ is generated as the sampling output data $x_o$ at intervals of 24 ms based on the flip-flop decision. Accordingly, the electrocardiogram data is displayed at high fidelity at a sampling rate decreased to 1/6 of 250 samples/s correspondingly to the limitative condition of the liquid crystal display unit.

What is claimed is:

1. A method of sampling input waveform signals during a predetermined sampling period by detecting a peak and a bottom in each period, the improvement comprising:

generating as hold values a peak level and a bottom level of an input waveform signal;

holding one of the peak level and bottom level as hold values by resetting one of a peak hold means and a bottom hold means to the level of said input waveform signal at a time of generating the hold values;

determining whether the peak hold means or the bottom hold means is resetting at a time of sampling or at a time prior to sampling; and generating a bottom level as a sampling value when the peak hold means is resetting at a time of sampling and generating a peak level as a sampling value when the bottom hold means is resetting at the time of sampling.

2. A method of sampling input waveform signals during a predetermined sampling period as defined by claim 1 wherein when both the peak hold means and the bottom hold means are not resetting at the time of sampling, one of the peak hold means and the bottom hold means which was the last to hold one of the peak level and bottom level as hold values determines which hold value will be generated as a sampling value.

3. A circuit for sampling input waveform signals during a predetermined sampling period by detecting a peak and a bottom in each period, the improvement comprising:

peak hold means for holding a peak level of an input waveform signal by resetting the peak hold means to a level of the input waveform signal, said peak hold means generating an actuating signal;

bottom hold means for holding a bottom level of an input waveform signal by resetting the bottom hold means to a level of the input waveform signal, said bottom hold means generating an actuating signal;

a flip-flop means triggered by an actuating signal from one of said peak hold means and bottom hold means, the actuating signal indicating whether said peak hold means or said bottom hold means is operating;

a signal selection means for generating said bottom level as a sampling value when the flip-flop means is triggered by the peak hold means actuating signal, said signal selection means generating said peak level as said sampling value when the flip-flop means is triggered by the bottom hold means actuating signal.

4. The circuit for sampling input waveform signals as defined in claim 3 wherein each of said peak hold means, said bottom hold means, said flip-flop means and said signal selection means comprise a discrete circuit.

* * * * *